US 8,306,157 B2

(12) United States Patent
Seendripu et al.

(10) Patent No.: US 8,306,157 B2
(45) Date of Patent: Nov. 6, 2012

(54) RECEIVER ARCHITECTURE WITH DIGITALLY GENERATED INTERMEDIATE FREQUENCY

(75) Inventors: Kishore Seendripu, Carlsbad, CA (US);
Raymond Montemayor, Carlsbad, CA (US); Sheng Ye, Carlsbad, CA (US);
Glenn Chang, Carlsbad, CA (US);
Curtis Ling, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 12/831,201

(22) Filed: Jul. 6, 2010

(65) Prior Publication Data

US 2011/0009080 A1 Jan. 13, 2011

Related U.S. Application Data

(63) Continuation of application No. 11/248,657, filed on Oct. 12, 2005, now abandoned.

(60) Provisional application No. 60/618,240, filed on Oct. 12, 2004.

(51) Int. Cl.
*H03D 3/22* (2006.01)

(52) U.S. Cl. ........ 375/332; 375/299; 375/316; 375/322; 375/327; 375/330

(58) Field of Classification Search .......... 375/150, 375/219, 226, 316, 322, 324, 329, 332, 345, 375/346, 349, 350, 354, 299, 306
See application file for complete search history.

(56) References Cited

U.S. PATENT DOCUMENTS

| 4,262,361 | A | 4/1981 | Hauer |
| 4,653,117 | A | 3/1987 | Heck et al. |
| 4,814,715 | A | 3/1989 | Kasperkovitz et al. |
| 5,101,499 | A | 3/1992 | Streck et al. |
| 5,999,802 | A | 12/1999 | Aschwanden |
| 6,166,668 | A | 12/2000 | Bautista et al. |
| 6,240,100 | B1 | 5/2001 | Riordan et al. |
| 6,275,540 | B1 | 8/2001 | Barrett, Jr. et al. |
| 6,282,413 | B1 | 8/2001 | Baltus |
| 6,330,290 | B1 | 12/2001 | Glas |
| 6,334,051 | B1* | 12/2001 | Tsurumi et al. ............... 455/324 |
| 6,356,218 | B1 | 3/2002 | Brown et al. |

(Continued)

FOREIGN PATENT DOCUMENTS

EP 431397 A2 6/1991

(Continued)

OTHER PUBLICATIONS

U.S. Appl. No. 11/106,061, filed Apr. 13, 2005, Ling.

(Continued)

*Primary Examiner* — Hirdepal Singh
(74) *Attorney, Agent, or Firm* — Kilpatrick Townsend & Stockton LLP (57) ABSTRACT

A receiver can be configured to include an RF front end that is configured to downconvert a received signal to a baseband signal or a low Intermediate Frequency (IF) signal. The receiver can downconvert the desired signal from an RF frequency in the presence of numerous interference sources to a baseband or low IF signal for filtering and channel selection. The filtered baseband or low IF signal can be converted to a digital representation. The digital representation of the signal can be upconverted in the digital domain to a programmable IF frequency. The digital IF signal can be converted to an analog IF signal that can be processed by legacy hardware.

9 Claims, 6 Drawing Sheets

U.S. PATENT DOCUMENTS

| | | | |
|---|---|---|---|
| 6,498,929 B1 | 12/2002 | Tsurumi et al. | |
| 6,606,359 B1 | 8/2003 | Nag et al. | |
| 6,704,555 B2* | 3/2004 | Sih et al. | 455/245.1 |
| 6,868,128 B1 | 3/2005 | Lane | |
| 6,940,916 B1 | 9/2005 | Warner et al. | |
| 7,068,171 B2* | 6/2006 | Gardenfors et al. | 340/572.1 |
| 7,146,146 B2 | 12/2006 | Masenten et al. | |
| 7,151,917 B2 | 12/2006 | Paulus | |
| 7,181,205 B1 | 2/2007 | Scott et al. | |
| 7,327,198 B2 | 2/2008 | Pan | |
| 7,346,128 B2 | 3/2008 | Hsu et al. | |
| 7,519,348 B2 | 4/2009 | Shah | |
| 7,532,870 B2 | 5/2009 | Ling | |
| 7,567,611 B2 | 7/2009 | Chien | |
| 7,778,613 B2 | 8/2010 | Seendripu et al. | |
| 7,941,102 B2* | 5/2011 | Kerth et al. | 455/75 |
| 2002/0151289 A1 | 10/2002 | Rahman et al. | |
| 2002/0160738 A1 | 10/2002 | Allott et al. | |
| 2003/0003891 A1 | 1/2003 | Kivekas et al. | |
| 2003/0008628 A1 | 1/2003 | Lindell et al. | |
| 2003/0012271 A1 | 1/2003 | McReynolds et al. | |
| 2003/0071925 A1 | 4/2003 | Kanno et al. | |
| 2003/0109276 A1* | 6/2003 | Wilson | 455/552 |
| 2003/0129955 A1 | 7/2003 | Gilmore | |
| 2003/0142234 A1 | 7/2003 | Dent | |
| 2003/0174641 A1 | 9/2003 | Rahman | |
| 2003/0176174 A1* | 9/2003 | Seppinen et al. | 455/226.1 |
| 2003/0186669 A1 | 10/2003 | Yamawaki et al. | |
| 2003/0207674 A1 | 11/2003 | Hughes | |
| 2004/0015246 A1 | 1/2004 | Gamm et al. | |
| 2004/0038649 A1 | 2/2004 | Lin et al. | |
| 2004/0106380 A1* | 6/2004 | Vassiliou et al. | 455/73 |
| 2004/0110482 A1* | 6/2004 | Chung | 455/302 |
| 2004/0137869 A1 | 7/2004 | Kim | |
| 2004/0146120 A1 | 7/2004 | Brown | |
| 2004/0152436 A1* | 8/2004 | Masenten et al. | 455/323 |
| 2004/0161025 A1* | 8/2004 | Mohindra | 375/219 |
| 2004/0176058 A1* | 9/2004 | Johnson | 455/147 |
| 2005/0059376 A1 | 3/2005 | Davis | |
| 2005/0069056 A1* | 3/2005 | Willingham | 375/327 |
| 2005/0221781 A1 | 10/2005 | Lin et al. | |
| 2005/0232382 A1 | 10/2005 | Stikvoort et al. | |
| 2005/0233723 A1 | 10/2005 | Gomez et al. | |
| 2005/0239428 A1 | 10/2005 | Seendripu et al. | |
| 2005/0248478 A1* | 11/2005 | Ling | 341/118 |
| 2005/0259186 A1 | 11/2005 | Mehr et al. | |
| 2006/0025099 A1 | 2/2006 | Jung et al. | |
| 2006/0073800 A1 | 4/2006 | Johnson et al. | |
| 2006/0078069 A1 | 4/2006 | Seendripu et al. | |
| 2006/0083335 A1 | 4/2006 | Seendripu et al. | |
| 2006/0160518 A1 | 7/2006 | Seendripu et al. | |
| 2006/0223457 A1 | 10/2006 | Rahman | |
| 2006/0252399 A1 | 11/2006 | Paulus | |
| 2007/0058755 A1 | 3/2007 | Husted | |
| 2007/0077908 A1 | 4/2007 | Vorenkamp et al. | |
| 2007/0123188 A1 | 5/2007 | Mo et al. | |
| 2007/0218850 A1 | 9/2007 | Pan | |
| 2008/0014895 A1 | 1/2008 | Li et al. | |
| 2008/0250460 A1 | 10/2008 | Khoini-Poorfard et al. | |
| 2008/0318536 A1 | 12/2008 | Suominen | |
| 2009/0088120 A1 | 4/2009 | Ling et al. | |
| 2010/0003943 A1 | 1/2010 | Seendripu et al. | |
| 2010/0167684 A1* | 7/2010 | Kerth | 455/339 |

FOREIGN PATENT DOCUMENTS

| | | |
|---|---|---|
| EP | 473373 A2 | 3/1992 |
| EP | 594894 A1 | 5/1994 |
| EP | 840484 A2 | 5/1998 |
| EP | 964557 A1 | 12/1999 |
| EP | 1164759 A2 | 12/2001 |
| EP | 1172928 A2 | 1/2002 |
| EP | 1182775 A2 | 2/2002 |
| EP | 1294151 A1 | 3/2003 |
| EP | 1300956 A1 | 4/2003 |
| EP | 1376967 A2 | 2/2004 |
| GB | 2392566 A | 3/2004 |
| JP | 59-186431 A | 10/1984 |
| JP | 09/36663 A | 2/1997 |
| JP | 11-041033 A2 | 2/1999 |
| JP | 11/225179 A | 8/1999 |
| JP | 2000/286643 A | 10/2000 |
| JP | 2004/179841 A | 6/2004 |
| WO | WO 97/06604 A1 | 2/1997 |
| WO | WO 98/45942 A3 | 10/1998 |
| WO | WO 02/29985 A2 | 4/2002 |
| WO | WO 2004/006433 A1 | 1/2004 |
| WO | WO 2005/101648 A1 | 10/2005 |
| WO | WO 2005/101671 A2 | 10/2005 |
| WO | WO 2006/044372 A2 | 4/2006 |
| WO | WO 2006/044373 A1 | 4/2006 |
| WO | WO 2006/063358 A1 | 6/2006 |

OTHER PUBLICATIONS

U.S. Appl. No. 11/106,055, filed Apr. 13, 2005, Seendripu et al.
U.S. Appl. No. 12/831,152, filed Jul. 6, 2010, Seendripu et al.
U.S. Appl. No. 12/831,225, filed Jul. 6, 2010, Seendripu et al.
Aschwanden, "Direct conversion-how to make it work in TV tuners," IEEE Transactions on Consumer Electronics, Aug. 1996, vol. 42, No. 3, pp. 729-738.
Guo, et al., "A Fully Integrated 90-MHz CMOS Wireless Receiver With On-Chip RF and IF Filters and 9-dB Image Rejection," IEEE Journal of Solid-State Circuits, Aug. 2002, vol. 37, No. 8, pp. 1084-1089.
Lee, et al. "Full-CMOS 2-GHz WCDMA Direct Conversion Transmitter and Receiver," IEEE Journal of Solid-State Circuits, Jan. 2003, vol. 38, No. 1, pp. 43-53.
Van Sinderen, et al., "A 48-860 MHZ Digital Cable Tuner IC With Integrated RF and IF Selectivity," International Solid-State Circuits Conference, 2003 Digest of Technical Papers, Feb. 12, 2003, 10 pages, IEEE.
Weaver, "A Third Method of Generation and Detection of Single-Sideband Signals", Proceedings of the IRE, 1956, vol. 44, No. 12, pp. 1703-1705.
Weldon, "A 1.75-GHz Highly Integrated Narrow-Band CMOS Transmitter With Harmonic-Rejection Mixers," IEEE Journal of Solid-State Circuits, Dec. 2001, vol. 36, No. 12, pp. 2003-2015.
European Communication for Application No. EP05733984.8, dated Sep. 17, 2007, 4 pages.
European Communication for Application No. EP05733984.8, dated Jun. 13, 2008, 5 pages.
European Communication for Application No. EP05733984.8, dated Oct. 27, 2009, 50 pages.
European Communication for Application No. EP05738651.8, mailed on May 16, 2008, 5 pages.
European Communication for Application No. EP05738651.8, dated Sep. 17, 2007, 2 pages.
European Communication for Application No. EP05809078.8, dated Feb. 2, 2008, 3 pages.
European Communication for Application No. EP05809078.8, dated Apr. 17, 2009, 5 pages.
European Communication for Application No. EP05810558.6, dated Dec. 13, 2007, 4 pages.
European Communication for Application No. EP05810558.6, dated Oct. 28, 2008, 4 pages.
European Communication for Application No. EP05853911.5, dated Oct. 8, 2007, 4 pages.
European Communication for Application No. EP05853911.5, dated May 2, 2008, 3 pages.
European Communication for Application No. EP05853911.5, dated Nov. 26, 2008, 3 pages.
European Search Report for Application No. EP10001057.8, dated Mar. 5, 2010, 8 pages.
Japanese Office Action for Application No. 2007/545724, mailed on Aug. 10, 2010, 8 pages.
International Search Report of Aug. 2, 2005 in International Application No. PCT/US2005/012906, 4 pages.
Written Opinion of Aug. 2, 2005 in International Application No. PCT/US2005/012906, 8 pages.
International Preliminary Report on Patentability of Oct. 26, 2006 in International Application No. PCT/US2005/012906, 10 pages.

International Search Report of the International Searching Authority for Application No. PCT/US2005/012907, dated Oct. 12, 2005, 6 pages.
Written Opinion of the International Searching Authority for Application No. PCT/US2005/012907, Oct. 12, 2005, 10 pages.
International Preliminary Report on Patentability of Oct. 26, 2006 in International Application No. PCT/US2005/012907, 12 pages.
International Search Report of the International Searching Authority for Application No. PCT/US2005036513, mailed on May 19, 2006, 6 pages.
Written Opinion of the International Searching Authority for Application No. PCT/US2005/036513, mailed on May 19, 2006, 8 pages.
International Preliminary Report on Patentability for Application No. PCT/US2005/036513, mailed on Apr. 26, 2007, 10 pages.
International Search Report of the International Searching Authority for Application No. PCT/US2005/036514, mailed on Feb. 7, 2006, 5 pages.
Written Opinion of the International Searching Authority for Application No. PCT/US2005/036514, mailed on Feb. 7, 2006, 8 pages.
International Preliminary Report on Patentability for Application No. PCT/US2005/036514, mailed on Apr. 26, 2007, 10 pages.
International Search Report of the International Searching Authority for Application No. PCT/US2005/045099, mailed on Apr. 3, 2006, 3 pages.
Written Opinion of the International Searching Authority for Application No. PCT/US2005/045099, mailed on Apr. 3, 2006, 4 pages.
International Preliminary Report on Patentability for Application No. PCT/US2005/045099, dated Jun. 21, 2007, 6 pages.
Non-Final Office Action for U.S. Appl. No. 11/106,055, mailed on Nov. 21, 2007, 11 pages.
Response to Non-Final Office Action for U.S. Appl. No. 11/106,055, filed Mar. 18, 2008, 18 pages.
Final Office Action for U.S. Appl. No. 11/106,055, mailed on May 7, 2008, 11 pages.
Response to Final Office Action for U.S. Appl. No. 11/106,055, filed Aug. 8, 2008, 19 pages.
Non-Final Office Action for U.S. Appl. No. 11/106,055, mailed on Sep. 30, 2008, 14 pages.
Response to Non-Final Office Action for U.S. Appl. No. 11/106,055, filed Mar. 27, 2009, 17 pages.
Final Office Action for U.S. Appl. No. 11/106,055, mailed on Jun. 4, 2009, 12 pages.
Response to Final Office Action for U.S. Appl. No. 11/106,055, filed Oct. 1, 2009, 20 pages.
Notice of Allowance for U.S. Appl. No. 11/106,055, mailed on Nov. 18, 2009, 6 pages.
Notice of Allowance for U.S. Appl. No. 11/106,055, mailed on Apr. 2, 2010, 12 pages.
Requirement for Restriction/Election for U.S. Appl. No. 11/106,061, mailed on Sep. 27, 2007, 7 pages.
Response to Requirement for Restriction/Election for U.S. Appl. No. 11/106,061, filed Oct. 26, 2007, 17 pages.
Non-Final Office Action for U.S. Appl. No. 11/106,061, mailed on Jan. 7, 2008, 11 pages.
Response to Non-Final Office Action for U.S. Appl. No. 11/106,061, filed May 21, 2008, 14 pages.
Notice of Allowance for U.S. Appl. No. 11/106,061, mailed on Sep. 10, 2008, 10 pages.
Supplemental Notice of Allowance for U.S. Appl. No. 11/106,061, mailed on Sep. 16, 2008, 6 pages.
Notice of Allowance for U.S. Appl. No. 11/106,061, mailed on Dec. 31, 2008, 8 pages.
Non-Final Office Action for U.S. Appl. No. 11/248,643, mailed on Aug. 20, 2008, 15 pages.
Response to Non-Final Office Action for U.S. Appl. No. 11/248,643, filed Feb. 20, 2009, 13 pages.
Response to Final Office Action for U.S. Appl. No. 11/248,643, filed Dec. 1, 2009, 14 pages.
Final Office Action for U.S. Appl. No. 11/248,643, mailed on Jun. 4, 2009, 10 pages.
Non-Final Office Action for U.S. Appl. No. 11/248,643, mailed on Jan. 6, 2010, 12 pages.
Non-Final Office Action for U.S. Appl. No. 11/248,657, mailed on Sep. 5, 2008, 20 pages.
Response to Non-Final Office Action for U.S. Appl. No. 11/248,657, filed Mar. 2, 2009, 15 pages.
Final Office Action for U.S. Appl. No. 11/248,657, mailed on Jun. 24, 2009, 11 pages.
Response to Final Office Action for U.S. Appl. No. 11/248,657, filed Dec. 17, 2009, 18 pages.
Non-Final Office Action for U.S. Appl. No. 11/248,657, mailed on Jan. 6, 2010, 20 pages.
Requirement for Restriction/Election for U.S. Appl. No. 11/302,531, mailed on Jul. 21, 2008, 9 pages.
Response to Requirement for Restriction/Election for U.S. Appl. No. 11/302,531, filed Sep. 12, 2008, 8 pages.
Non-Final Office Action for U.S. Appl. No. 11/302,531, mailed on Oct. 29, 2008, 15 pages.
Non-Final Office Action for U.S. Appl. No. 12/432,666, mailed on May 26, 2010, 20 pages.
Non-Final Office Action for U.S. Appl. No. 12/831,152, mailed Jun. 2, 2011, 9 pages.
Final Office Action for U.S. Appl. No. 12/831,225, mailed Oct. 7, 2011, 19 pages.
Non-Final Office Action for U.S. Appl. No. 12/831,225, mailed on Dec. 8, 2010, 30 pages.
European Search Report for Application No. EP09006094.8, dated Apr. 25, 2012, 10 pages.
Notice of Allowance for Japanese Patent Application No. 2007-508580, mailed on Mar. 1, 2012, 4 pages.
Japanese Final Office Action for Application No. 2007-508580, mailed Aug. 10, 2011, 11 pages.
Japananse Office Action for Application No. 2007-508580, mailed Jan. 4, 2011, 8 pages.
Partial European Search Report for Application No. EP09006094.8, ddated Nov. 28, 2011, 5 pages.
Final Office Action for U.S. Appl. No. 12/831,152, mailed on Dec. 16, 2011, 9 pages.

\* cited by examiner

RECEIVER ARCHITECTURE WITH DIGITALLY GENERATED INTERMEDIATE FREQUENCY

CROSS-REFERENCES TO RELATED APPLICATIONS

This application is a continuation of U.S. application Ser. No. 11/248,657, filed Oct. 12, 2005, which claims benefit under 35 U.S.C. 119(e) of U.S. Application No. 60/618,240, filed Oct. 12, 2004, both of which are incorporated herein by reference in their entirety.

BACKGROUND

The disclosure relates to electronic signal processing. More particularly, the disclosure relates to an RF receiver and receiver architecture.

In a typical frequency division multiplex communication system, multiple transmissions can simultaneously occupy a predefined operating band. The signals within the operating band can operate according to a predetermined communication standard, and thus, can have an energy within a predictable dynamic range. The communication standard can also specify a frequency spacing between adjacent channels, and the channel bandwidth. The communication standard can also specify signal parameters, such as modulation type, information rates, out of channel performance, as well as other signal parameters.

Additionally, there can be numerous signal sources operating outside of the operating band. Unlike the signals within the operating band, the out of band signals are typically not regulated by the communication standard regulating the in band signal performance. As a result, out of band signals may have substantially greater energy relative to the in-band signals, and can operate according to different signal parameters, including modulation type, out of band performance, and other parameters.

In order to tune to a desired channel, a receiver needs to substantially eliminate the effects of undesired channels, including those known interferers occurring within known operating bands as well as unanticipated interferers.

Many receiver implementations have been developed to support the various communication standards. The trend of increasing device complexity and performance while simultaneously reducing the physical size of electronic devices imposes tremendous constraints on ongoing development.

For example, the size of cellular and cordless telephones continues to shrink while simultaneously improving the quality of the device and adding additional functionality to the device. Similarly, radios and televisions are constantly being redesigned to provide improved features and operating modes while simultaneously decreasing physical size. Although the screen size available in television receivers continues to grow, the advancement of technologies that enable flat screens and short depths greatly reduce the volume available for electronics.

It is desirable to increase the ability of a receiver to operate in multiple modes or frequency bands without compromising received signal quality. Additionally, it is desirable for a receiver implementation to minimize size, cost, and power consumption over implementations presently available.

BRIEF SUMMARY

A receiver can be configured to include an RF front end that is configured to downconvert a received signal to a baseband signal or a low Intermediate Frequency (IF) signal. The receiver can downconvert the desired signal from an RF frequency in the presence of numerous interference sources to a baseband or low IF signal for filtering and channel selection.

The filtered baseband or low IF signal can be converted to a digital representation. The digital representation of the signal can be upconverted in the digital domain to a programmable IF frequency. The digital IF signal can be converted to an analog IF signal that can be processed by legacy hardware.

The disclosure includes a receiver that includes a downconverter configured to downconvert an input signal to a signal in a first frequency band, an analog to digital converter (ADC) coupled to the downconverter and configured to digitize the signal in the first frequency band to produce a digital representation of the signal in the first frequency band, and a digital upconverter configured to upconvert the digital representation of the signal in the first frequency band to a digital representation of the signal in a second frequency band.

The disclosure includes a receiver that includes a first frequency converter configured to downconvert a received signal to an in-phase baseband signal component, a second frequency converter configured to downconvert the received signal to a quadrature baseband signal component, a first analog filter coupled to the first frequency converter and configured to perform at least partial channel selection on the in-phase baseband signal component, a second analog filter coupled to the second frequency converter and configured to perform at least partial channel selection on the quadrature baseband signal component, a first Analog to Digital Converter (ADC) coupled to the first analog filter and configured to convert the in-phase baseband signal component to a digital in-phase baseband signal component, a second ADC coupled to the second analog filter and configured to convert the quadrature baseband signal component to a digital quadrature baseband signal component, a first digital filter coupled to the first ADC and configured to digitally filter the digital in-phase baseband signal component to generate a digitally filtered in-phase baseband signal component, a second digital filter coupled to the second ADC and configured to digitally filter the digital quadrature baseband signal component to generate a digitally filtered quadrature baseband signal component, a first digital upconverter configured to digitally upconvert the digitally filtered in-phase baseband signal component to an in-phase Intermediate Frequency (IF) signal component at a desired IF, a second digital upconverter configured to digitally upconvert the digitally filtered quadrature baseband signal component to a quadrature IF signal component at the desired IF, and a digital signal combiner configured to combine the in-phase IF signal component with the quadrature IF signal component.

The disclosure includes a method of receiving a signal that includes frequency converting an input signal to an intermediate signal in a first frequency band, digitizing the intermediate signal, and digitally converting the intermediate signal to a second frequency band.

The disclosure includes a method of calibrating a quadrature receiver. The method includes injecting a calibration tone to a signal path of a quadrature receiver, detecting an amplitude and phase imbalance of the quadrature receiver, adjusting a gain of at least one of an in-phase and a quadrature signal path based on the amplitude imbalance, and adjusting a phase of at least one of the in-phase and quadrature signal paths based on the phase imbalance.

The disclosure includes a quadrature receiver calibration apparatus, that includes a tone generator configured to generate a calibration tone, a coupler configured to couple the calibration tone to a signal path of the quadrature receiver, a detector configured to detect an in-phase and quadrature signal component when the calibration tone is coupled to the signal path, a gain feedback module configured to adjust a gain of at least one of an in-phase signal path and a quadrature signal path, and a phase feedback module configured to adjust a phase of at least one of the in-phase signal path and the quadrature signal path.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF EMBODIMENTS OF THE INVENTION

A receiver architecture is disclosed where the receiver performs conversion to zero Intermediate Frequency (IF) or low IF, performs anti-aliasing and partial channel selection filtering, converts the zero- or low-IF signal to the digital domain, performs frequency conversion by digital processing (for example mixing) to an arbitrary intermediate frequency, then converts the signal back to the analog domain with a digital-to-analog converter.

This approach provides the receiver with the following key advantages: an architecture suitable for single-chip implementation; flexible channel selection and IF filtering compatible with analog and digital standards; hybrid operation allowing a choice of either a low-IF or direct conversion; flexible choice of IF; substantially perfect conversion of In-phase and Quadrature signal paths to the IF as a result of the digital implementation; the option to perform digital baseband/low-IF processing; and an analog output that can be used by a wide variety of existing demodulator processors.

The disclosed receiver is configured to select a relatively narrow-band signal (the desired "channel") from among many undesired channels ("interferers"), filter out the interferers, and convert the desired channel to an arbitrary IF compatible with existing demodulators, while introducing minimal spurious signals, distortion and noise.

The receiver is configured to perform a low-IF or zero-IF conversion, which allows relatively low-power, efficient filtering to take place at the baseband or low IF. The downconverted signal is digitized. This takes advantage of natural anti-aliasing performed by any channel selection, while enabling digital signal processing downstream.

The receiver the performs upconversion in the digital domain to a desired IF. Digital upconversion allows the process to be performed with substantially no mismatches in the I and Q path, eliminating substantially all IF feedthrough and poor complex image rejection. The resulting digital IF signal can be converted to the analog domain and filtered using an on-chip anti-aliasing filter at the IF. This allows generating an analog IF signal compatible with a range of existing demodulators.

The receiver can be implemented by joining a zero- or low-IF receiver with a digital baseband portion, a digital IF generator, and a digital implementation of a transmitter where the output signal is converted back to the analog domain. The receiver architecture is particularly advantageous because the typical desired output intermediate frequency is at a sufficiently low frequency to allow data conversion to be performed by relatively low-power, low-complexity circuits.

Figure 1:
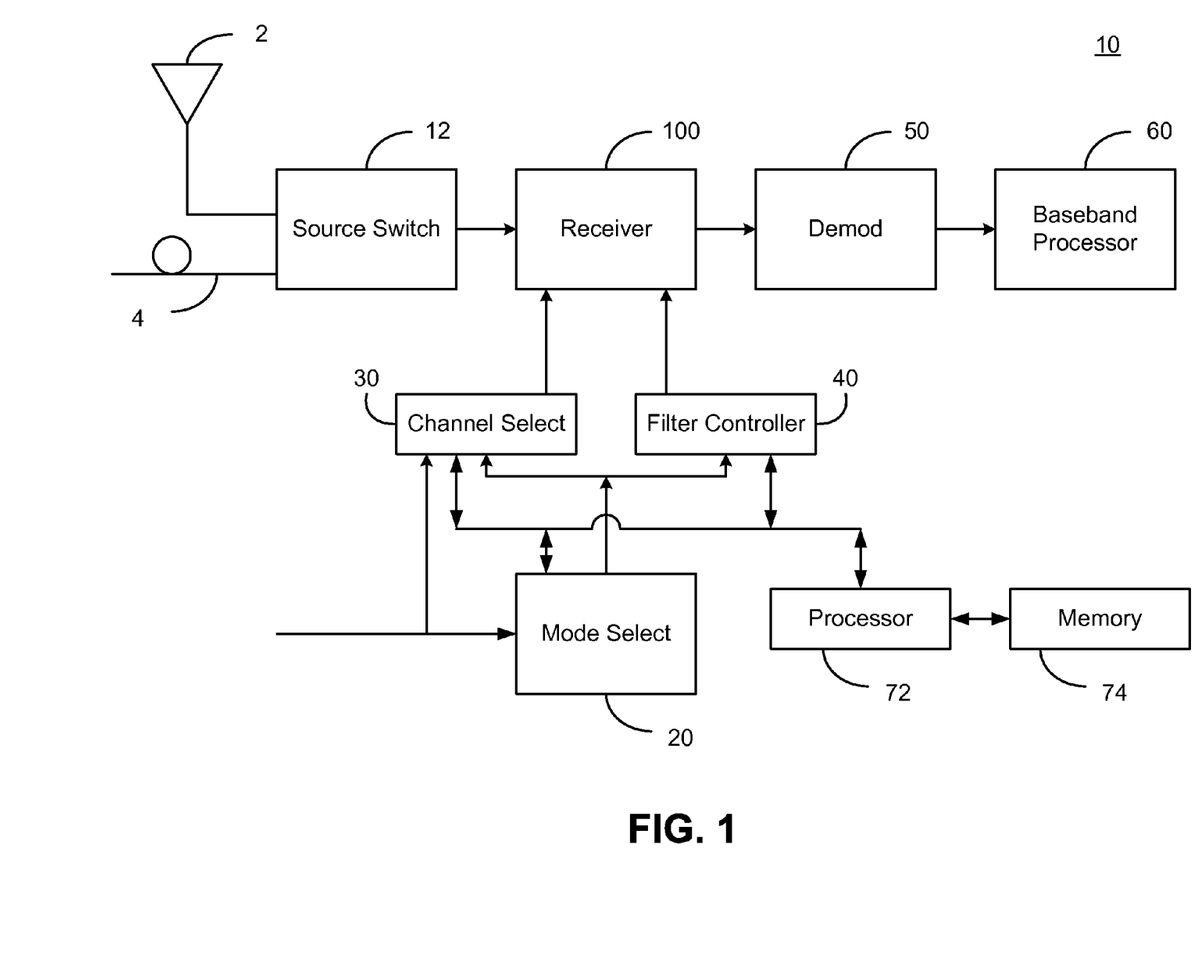
FIG. 1 is a simplified functional block diagram of an embodiment of a receiver in a system.

FIG. 1 is a simplified functional block diagram of an embodiment of a receiver 100 implementing digital IF generation in a system 10. The following description describes an embodiment in which the system 10 is configured to operate as a television receiver. However, the system 10 can be any of a plurality of systems. For example, the system 10 can be a television, television receiver, set top box, or television tuner integrated within a video recorder or some other television receiver. In other embodiments, the system 10 can be a radio receiver, wireless transceiver, telephone receiver, cellular telephone, cordless telephone, or some other communication device.

The system 10 can include a source switch 12 that can be coupled to one or more signal sources. For example, a first source input can be coupled to an antenna 2 and a second source input can be coupled to a wired source, such as a cable coupled to a cable television distributor. The source switch 12 is not limited to coupling only one type of signal to the receiver 100. For example, the source switch 12 can be coupled to a television signal source, for example, via the antenna 2, and can be coupled to a radio source, for example, via the cable 4.

The source switch 12 can be configured to couple any one of the signals from any signal source to the input of the receiver 100. The receiver 100 can be, for example, configured to selectively process television signals received from a signal source, such as analog television signals formatted according to an analog television standard, such as NTSC, PAL, SECAM, or some other analog television standard. The receiver 100 can also be configured to process digital television signals, such as digital DVB-T television signals, received from one of the signal sources.

The receiver 100 can receive the RF signal from the source switch 12 and can downconvert the signal to an output IF. The output IF from the receiver 100 can be coupled to a demodulator 50 and from the demodulator 50 to a baseband processor 60. In one embodiment, the demodulator 50 can be configured to demodulate a television signal at a predetermined IF. The demodulated television signals are communicated to a baseband processor 60 that can be configured, for example, to format the signals into video and audio signals for corresponding video and audio output devices (not shown).

The system 10 can also include a mode selection module 20 that can be configured to receive a mode selection input from an external source (not shown) that can be, for example, a user selection or user control. The mode can correspond to an operating mode of the receiver 100, and can be used to determine a particular operating band, channel spacing, channel bandwidths, and output IF frequency.

The mode select module 20 can be coupled to a channel select module 30. The channel select module 30 can be coupled to the mode select module 20 and can be configured to generate the desired local oscillator (LO) control signals. The channel select module 30 can generate the control signals needed to tune the LO frequencies of the receiver 100 to enable reception of the desired RF signal and generation of the desired output IF. The channel select module 30 can also receive one or more input signals from an external source (not shown), such as a user interface or some other module or device that can indicate a desired channel selection.

The channel select module 30 can independently control the RF and IF LOs within the receiver 100. For example, the channel select module 30 can tune the RF LO to a frequency that is based on both a mode and a desired channel. The channel select module 30 can also be configured to control the frequency of the IF LO and may be configured to control the IF LO based only on the desired mode. In other embodiments, the channel select module 30 can be configured to tune both the RF and LO frequencies for each channel.

The channel select module 30 can also be configured to control calibration of the receiver 100. The calibration can include DC offset calibration and In-phase (I) and Quadrature (Q) signal balancing. For example, the channel select module 30 can control an RF switch within the receiver 100 and can initiate the DC offset calibration. In another embodiment, a calibration module within the receiver 100 can receive the channel select signals and the filter control signals and can initiate DC offset calibration, including controlling the RF switch and filter bandwidths during the duration of the DC offset calibration.

A filter controller 40 can also be coupled to the mode select module 20. The filter controller 40 can be configured to provide the control signals to the receiver 100 that control one or more filter bandwidths within the receiver 100. The filter controller 40 can be configured to set the filter bandwidths based on the channel selectivity required in the receiver 100, which can depend on the operating mode.

The filter controller 40 can also be in communication with the channel select module 30. The filter controller 40 can be configured to control the filters within the receiver 100 to predetermined bandwidths for a predetermined calibration duration following each channel change. For example, the filter controller 40 can be configured to tune the filters to a minimal bandwidth during DC offset calibration. Alternatively, a calibration module within the receiver 100 can be configured to control the filter bandwidths during the calibration duration.

A processor 72 and associated memory 74 can be included within the system 10 and can be configured to perform one or more functions within each of the modules. For example, the memory 74 can include one or more processor 72 usable instructions in the form of software that can, when executed by the processor 72, perform some or all of the functions of the various modules within the system 10.

Figure 2:
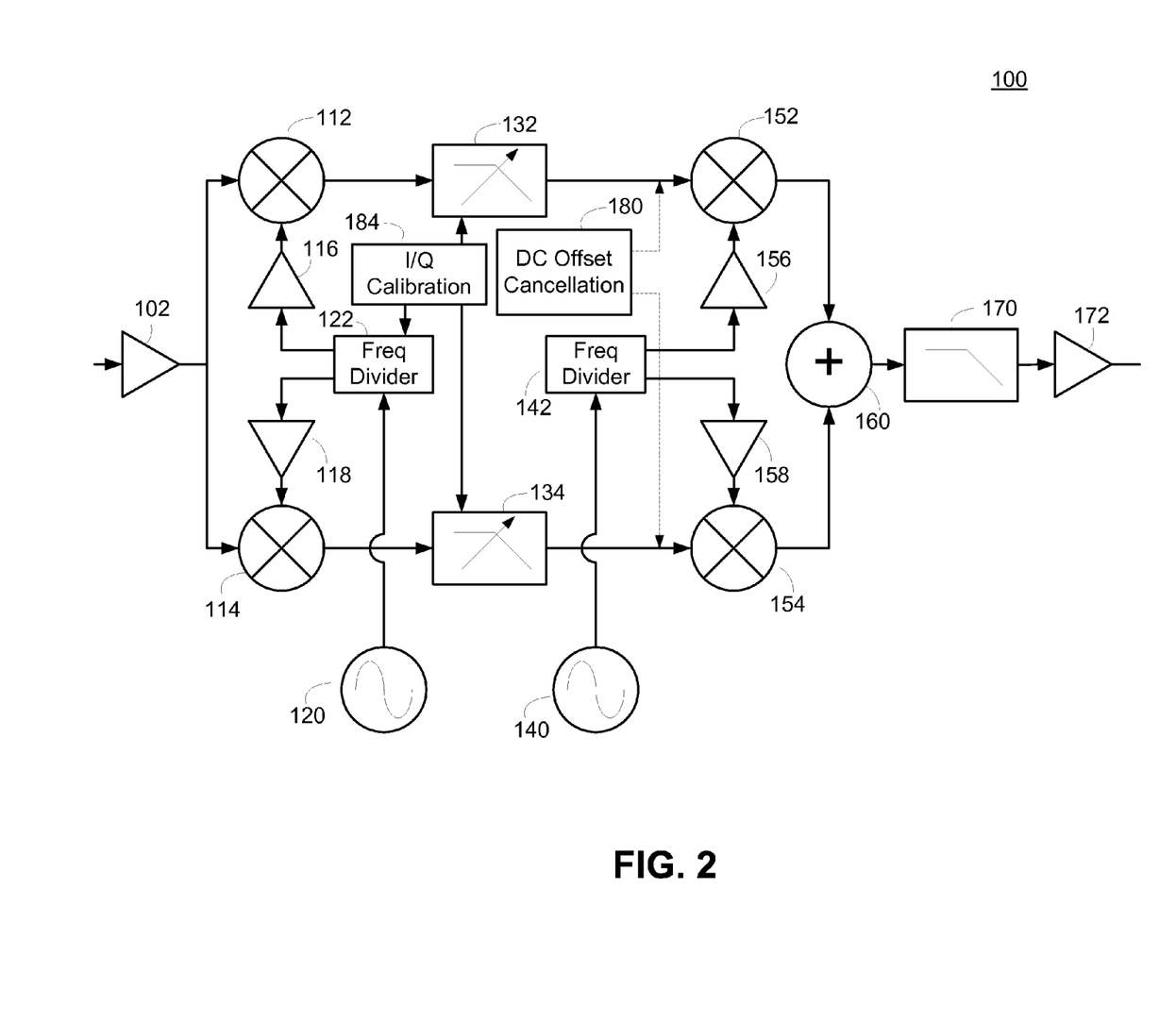
FIG. 2 is simplified functional block diagram of an embodiment of a receiver.

FIG. 2 is a simplified functional block diagram of an embodiment of a receiver 100 that can be implemented on one or more substrates of one or more integrated circuits (ICs). In some embodiments, it may be advantageous to integrate the entire receiver on a single IC. In other embodiments, it may be advantageous to integrate a portion of the receiver 100 in a first IC or on a first substrate and integrate the remainder of the receiver 100 on a second IC or second substrate. The first and second substrates can be implemented in a single package or may be implemented in distinct packages. For example, a signal path within the receiver 100 can be implemented on a first substrate and one or more local oscillators can be implemented on a second substrate and couple to the first substrate through one or more interconnects.

Although the signal interconnections shown in FIG. 2 appear as single ended signal interconnects, it is generally understood that some or all of the interconnections can be implemented as differential connections. It may be advantageous to implement differential interconnections, for example, for the purposes of noise reduction.

Portions of the receiver 100 can be implemented digitally, and can be configured to operate on digital representations of the signal. The digital processing of the signals within the receiver 100, and embodiments of receivers 100 having digital portions, are described in further detail in subsequent figures. The embodiment of FIG. 2 does not explicitly illustrate the digital portions to allow the description to focus on the functionality of the various blocks and modules.

The receiver 100 can include an RF amplifier 102 that is configured to receive a signal at the input to the receiver 100 and amplify it. The RF amplifier 102 can be configured to receive a signal, for example, from an interconnect to an antenna or wired connection, such as a single ended wireline, a differential wireline, a twisted pair, a coaxial cable, a transmission line, a waveguide, an optical receiver configured to receive an optical signal over an optical fiber, and the like, or some other signal medium.

The RF amplifier 102 can be configured in any of several different embodiments or combination of embodiments, depending on the application. In one embodiment, the RF amplifier 102 can be a Low Noise Amplifier (LNA). In another embodiment, the RF amplifier 102 can be a variable gain amplifier, and the gain of the RF amplifier can be selected by one or more control lines (not shown) to the receiver 100. In the embodiment where the RF amplifier 102 is a variable gain amplifier, the gain of the RF amplifier 102 can be part of a gain control loop, such as an automatic gain control (AGC) loop (not shown). The RF amplifier 102 can be configured as a single amplifier stage or can include multiple amplifier stages. Where multiple amplifier stages are used, the amplifier stages can include serial, parallel, or a combination of serial and parallel amplifier configurations.

The output of the RF amplifier 102 can be coupled to inputs of first and second frequency conversion modules, here shown as a first mixer 112 and a second mixer 114. The first and second mixers 112 and 114 are shown as mixers, but can be any type of frequency conversion device. For example, the first and second mixers 112 and 114 can be double balanced mixers, double-quadrature mixers, harmonic reject mixers, interferometers, or some other type of frequency conversion device. The first and second mixers 112 and 114 can be configured to generate in-phase (I) and quadrature (Q) frequency converted signal components. The first mixer 112 is described as part of the in-phase signal path and the second mixer 114 is described as part of the quadrature signal path for purposes of discussion.

An RF LO 120 can be configured to generate a local oscillator signal to frequency convert the received RF signal to a baseband signal or a low Intermediate Frequency (IF) signal. As used herein, the term baseband signal refers to baseband signals as well as to signals that are substantially baseband signals. A signal is substantially a baseband signal if the frequency conversion process to downconvert a signal is imperfect, for example, due to LO offset errors or differences at the transmitter or receiver and errors or differences in the RF signal relative to a specified frequency of operation. For example, an RF signal may be different from a specified operating channel due to LO frequency shifts at the transmitter or Doppler shifts. Typically, the error or difference is a fraction of the baseband signal bandwidth.

A low IF signal can refer to an IF frequency that is less than twice the baseband signal bandwidth. However, in other embodiments, low IF can refer to less than 1.5, 2.5, 3, 4, 5, 10, or some other multiple of the baseband signal bandwidth. Typically, a low IF signal refers to a signal that is at a frequency sufficiently low to allow processing of the signal without additional frequency conversions.

The receiver 100 can be configured to operate using direct conversion to baseband in some operating modes while converting to a low IF in other operating modes. For example, the receiver 100 can operate in low-IF mode for analog TV applications, and zero-IF for digital applications. Using distinct frequency conversion modes for separate operating modes may be advantageous because the receiver 100 architecture can be optimized for signal characteristics.

Analog television standards such as NTSC or PAL require less channel selection and image rejection in its low-pass filtering, but are much more sensitive to DC offset which typically are present in a zero-IF implementation. This makes an analog television receiver 100 more suited for a low-IF implementation, which may suffer from poorer channel selectivity, but which also substantially eliminates the DC offset problems associated with zero-IF.

Digital TV (e.g. DVB-T) requires greater channel selection, but is less sensitive to DC offset that may be introduced by a zero-IF architecture. This makes digital TV well-suited for a zero-IF approach, which offers better channel selectivity and no image rejection limitations, but may introduce some DC offset to the signal.

The frequency of the RF LO 120 can be programmable, and the frequency can be programmed based in part on the frequency of the desired signal. In a direct conversion frequency conversion, the output of the RF LO 120 can be substantially equal to the center frequency of a double side band input signal. In other embodiments, the RF LO 120 can be tuned to a frequency that is a multiple of the desired input frequency. In the embodiment of FIG. 2, the RF LO 120 can be tuned to a frequency that is substantially four times the frequency of the desired signal.

The output of the RF LO 120 can be coupled to a first phase shifter 122 that can be configured to generate at least two distinct versions of a LO signal that are in quadrature. Because inaccuracies in the quadrature LO signals can contribute to undesired signal components in the recovered signal, it is desirable to generate accurate quadrature LO signals. In one embodiment, the first phase shifter 122 can include a phase shifted signal path and a direct signal path, where the phase shifted signal path results in a signal that is substantially 90 degrees shifted relative to the signal from the direct signal path. In another embodiment, the first phase shifter 122 can include a polyphase filter that is configured to generate the two LO signals in quadrature. In the embodiment shown in FIG. 2, the first phase shifter can be implemented within the divide by four scaler.

The in-phase LO signal can be coupled to an in-phase LO buffer amplifier 116 that amplifies the in-phase LO signal and couples it to a LO input port of the first mixer 112. Similarly, the quadrature LO signal can be coupled to a quadrature LO buffer amplifier 118 that amplifies the quadrature LO signal and couples it to a LO port of the second mixer 114.

The output of the first mixer 112 can be an in-phase baseband signal that is coupled to an in-phase filter 132. The in-phase filter 132 can be programmable filter whose bandwidth can be selected based on one or more control signals (not shown) provided to the receiver 100. The bandwidth of the in-phase filter 132 can be selected, for example, based on a communication standard or mode that the receiver 100 is configured to support. Therefore, where the receiver 100 is configured to support multiple standards having different channel bandwidths, the bandwidth of the in-phase filter 132 can be selected based in part on the presently supported mode.

When the signal is a baseband signal or a low IF signal, the in-phase filter 132 can be configured as a low pass filter. Alternatively, the in-phase filter 132 can be configured as a bandpass filter if the low IF signal has sufficient bandwidth to make the use of a low pass filter undesirable.

The output of the in-phase filter 132 can be coupled to a third mixer 152 configured to frequency convert the in-phase signal to a desired output IF. In one embodiment, the output of the in-phase filter 132 is a baseband signal and the third mixer is configured to upconvert the in-phase baseband signal to an output IF.

The third mixer 152 can be driven by a programmable LO that is generated in much the same manner that is used to generate the LO for the first and second mixers 112 and 114. A programmable IF LO 140 can be configured to generate a signal that is substantially four times the desired output IF. The IF LO 140 can be programmable to allow the output IF to be selected based in part on the mode supported by the receiver 100. For example, the receiver 100 can be configured to frequency convert the input signals to a predetermined IF that can depend on the manner in which the user configures the system having the receiver 100. For example, a set top box for television signals can be configured to generate an output signal at a predetermined IF, such as 70 MHz, or at a frequency corresponding to a television channel.

The output of the IF LO 140 can be coupled to a second phase shifter 142 that can be implemented in a divide by four circuit. An in-phase LO output from the second phase shifter 142 can be coupled to an in-phase buffer amplifier 156 that amplifies the in-phase LO signal and couples it to the LO input of the third mixer 152. The output of the third mixer 152 is an in-phase IF signal that is coupled to a first input of a signal combiner 160.

The quadrature signal path is configured to be substantially identical to the in-phase signal path. The two signal paths are typically substantially matched to reduce undesirable signal components that can be generated due to I and Q mismatches.

The output of the second mixer 114 can be a baseband quadrature signal that is coupled to an input of a quadrature filter 134. The quadrature filter 134 can be configured as a programmable low pass filter having programmable bandwidth. Typically, the configuration and bandwidths of the in-phase and quadrature filters 132 and 134 are the same such that the in-phase and quadrature signal paths remain substantially matched.

The output of the quadrature filter 134 can be coupled to an input of a fourth mixer 154 that is configured to upconvert the quadrature signal to the output IF. The fourth mixer 154 is driven by an LO signal that is generated by the IF LO 140. The output of the IF LO 140 is coupled to a second phase shifter 142 that generates a quadrature LO signal. The quadrature LO signal is coupled to a quadrature buffer amplifier 158 which amplifies the quadrature LO signal and couples it to an LO input of the fourth mixer 154. The output of the fourth mixer 154 can be a quadrature IF signal. The quadrature IF signal can be coupled to a second input of the signal combiner 160.

The signal combiner 160 can be configured to combine the in-phase and quadrature IF signals. The signal combiner 160 can be, for example, a signal summer that sums the in-phase IF signal with the quadrature IF signal. In one embodiment, the signal combiner 160 sums the two signals maintaining their phases. In another embodiment, the signal combiner 160 can invert one of the phases and sum the two signals. In yet another embodiment, the signal combiner 160 can generate the sum of the two signals and can invert the output signal.

The output of the signal combiner 160 represents the output IF signal. The output IF signal can be coupled to an output filter 170 that can be, for example, a low pass filter or bandpass filter that is configured to remove undesired signal products from the IF output signal. The output filter 170 can be configured as a fixed bandwidth filter or can be configured as a programmable bandwidth filter, where the bandwidth is determine, in part, based on a mode of the receiver 100.

The output of the output filter 170 can be coupled to an IF amplifier 172 that can be configured to amplify the output. The IF amplifier 172 can be a variable gain amplifier. The gain of the IF amplifier 172 can be controlled using one or more control inputs (not shown) on the receiver 100. The output of the IF amplifier 172 can be the output of the receiver 100.

The receiver 100 can also include a DC offset cancellation module 180 configured to substantially remove the DC component on each of the in-phase and quadrature signal paths. DC signals at the inputs to the third and fourth mixers 152 and 154 result in the generation of LO signals at the outputs of the respective third and fourth mixers 152 and 154. Because the LO signal can represent an undesired signal, the receiver 100 can incorporate a DC offset cancellation module 180 that monitors the DC offset and compensates for it to substantially remove it from both the in-phase and quadrature signal paths prior to upconversion to the output IF.

The receiver 100 can also include an I/Q calibration module 184. The receiver 100 can reduce the contribution due to undesired signals if the in-phase (I) and quadrature (Q) signal paths can be balanced. The I/Q calibration module 184 can reduce or substantially eliminate gain differences in the I and Q signal paths and can ensure that the I and Q signal paths are substantially in quadrature.

The I/Q calibration module 184 can be coupled to one or more gain stages in each of the I and Q signal paths. In the embodiment shown in FIG. 2, the I/Q calibration module 184 is coupled to the filters 132 and 134 in the I and Q signal paths. The I/Q calibration module 184 can be configured to adjust the gain through one or more of the filters in order to balance the gains of the I and Q signal paths. Additionally, the I/Q calibration module 184 can be configured to adjust the phase offset contributed by the first phase shifter 122 in order to maintain the quadrature nature of the two signal paths.

It may be advantageous to implement the entire receiver 100 on a single integrated circuit, such that the processes and conditions used to manufacture the in-phase and quadrature signal components are closely matched, resulting in more closely matched I and Q signal paths.

Additionally, it may be advantageous to implement the components on a single IC to minimize path length distances or variations that contribute to mismatches. A single IC implementation can also result in a smaller receiver 100 package.

Figure 3:
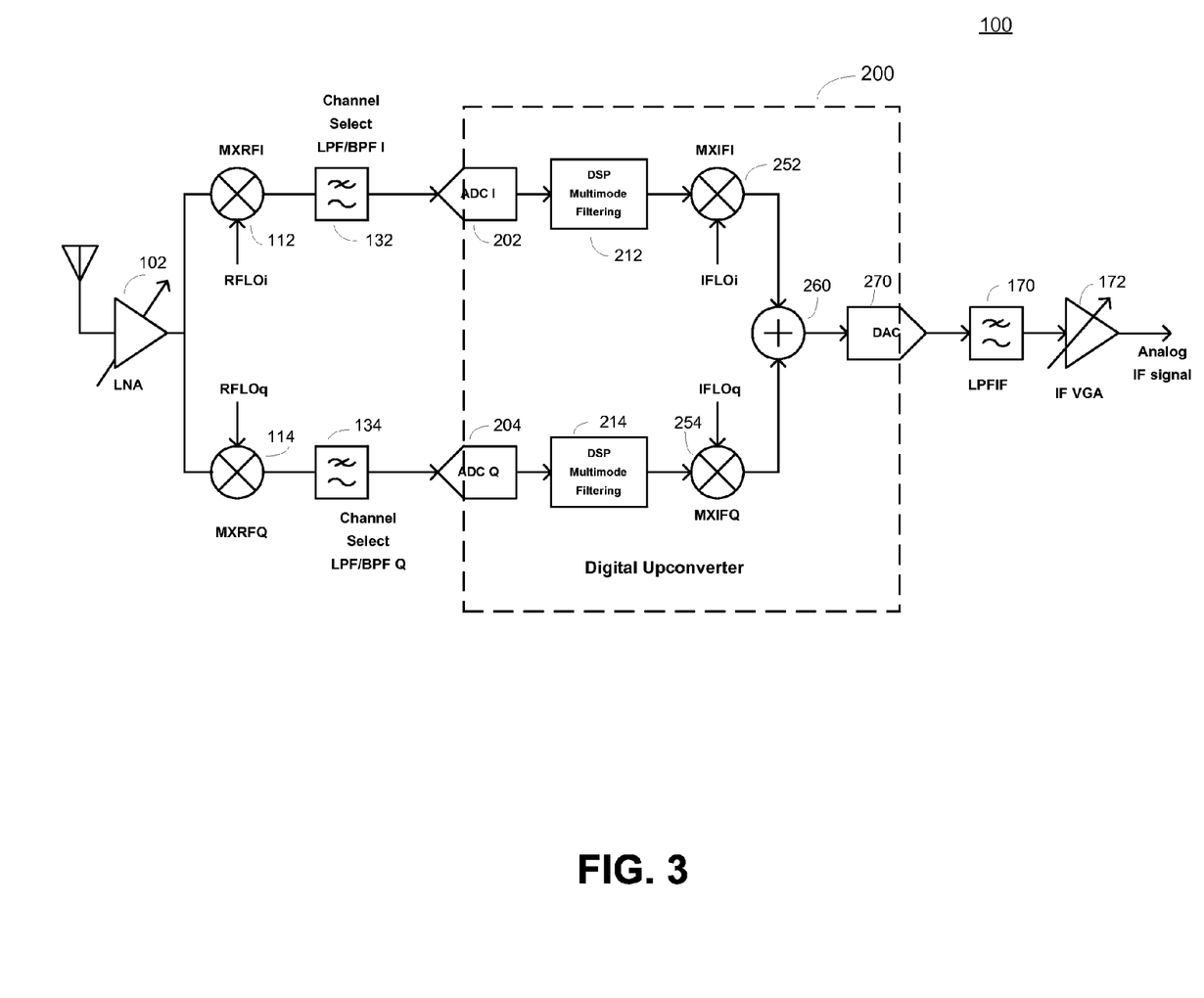
FIG. 3 is a simplified functional block diagram of an embodiment of a receiver with digital frequency conversion.

FIG. 3 is a simplified functional block diagram of a receiver 100 implementing a digital IF generation module 200. The receiver 100 implements some of the functionality in analog domain and other functionality in the digital domain in order to capitalize on various advantages of the respective domains. The functional block diagram of FIG. 3 omits some blocks for the sake of clarity. For example, the RF and IF LOs and their respective phase shifters are not illustrated, nor are the DC offset and I/Q calibration modules illustrated.

The RF portion of the receiver 100 embodiment of FIG. 3 is configured similar to that shown and described in FIG. 2. An RF amplifier 102, here depicted as a variable gain LNA, is configured to receive an input signal at a desired RF frequency. The input signal can be within an operating band of possible input signals and undesired channels within the operating band may appear as interference sources.

The output of the RF amplifier 102 is coupled to first and second mixers, 112 and 114, configured to downconvert I and Q signal components, respectively, to I and Q baseband or low IF signals. The output of the first mixer 112 represents the I baseband or low IF signal. The signal is coupled to a the in-phase filter 132. The in-phase filter 132 can be configured to provide at least partial channel selection. The in-phase filter 132 can be configured to provide at least a portion of the desired channel selectivity. A remaining portion of channel selection can be implemented in the digital domain, as will be described below. The in-phase filter 132 can also operate as an anti-aliasing filter to substantially suppress aliased components after digitizing the signal.

Similarly, the output of the second mixer 114 represents the quadrature signal. The quadrature signal is coupled to the quadrature filter 134 for partial channel selection and anti-alias filtering. The shape of the in-phase and quadrature filters 132 and 134 can be determined, in part, by the amount of channel selection performed by subsequent digital filters. Additionally, the shape of the anti-aliasing filter response can be determined in part by the sampling rate of the subsequent digitizing operation.

The output of the in-phase and quadrature filters, 132 and 134, is coupled to a digital IF generator 200 configured to digitally filter and upconvert the I and Q signals to a selectable IF. The digital IF generator 200 can also be configured to convert the digital IF signal to an analog signal representation. The digital IF generator 200 can thus be configured to accept analog I and Q signal inputs, digitally filter and upconvert the signals and combine them into a composite digital IF signal, and convert the digital IF signal to an analog IF signal. A module that interfaces with the digital IF generator 200 can be completely unaware of the digital processing performed by the digital IF generator 200.

The digital IF generator 200 includes a first Analog to Digital Converter (ADC) 202 configured to receive the downconverted in-phase signal and convert it to a digital representation. The digitized in-phase signal can be coupled to a first digital filter 212. The first digital filter 212 can be configured to perform channel selection on the digitized in-phase signal. In one embodiment, the first digital filter 212 can be configured to provide the desired channel selectivity response. In another embodiment, the first digital filter 212 can be configured to have a frequency response that operates in conjunction with the in-phase filter 132 to produce the desired channel selectivity.

The output of the first digital filter 212 can be coupled to a first digital frequency converter 252 configured to frequency convert the filtered in-phase digital signal to an in-phase digital IF. The output of the first digital frequency converter 252 is coupled to a first input of a digital signal combiner 260.

The digital IF generator 200 includes a quadrature signal path that is complementary to the in-phase signal path. A second ADC 204 is configured to accept the quadrature signal from the quadrature filter 134. The second ADC 204 converts the quadrature signal to a digital representation and couples the digital quadrature signal to a second digital filter 214.

The second digital filter 214 filters the digital quadrature signal to provide the desired channel selectivity. The filtered digital quadrature signal is coupled to a second digital frequency converter 254 configured to frequency convert the filtered quadrature digital signal to a quadrature digital IF signal. The output of the second digital frequency converter 254 is coupled to a second input of the digital signal combiner 260.

The first and second digital filters 212 and 214 can be configured with fixed bandwidths or can be configured to have controllable bandwidths and frequency responses. IN one embodiment, the bandwidths and frequency responses of the first and second digital filters 212 and 214 are substantially the same. In another embodiment, the first and second digital filters 212 and 214 can have distinct bandwidths and frequency responses. In some embodiments, the bandwidth and frequency response can be based in part on an operating mode of the receiver 100. For example, the first and second digital filters 212 and 214 can be configured with a first response if the receiver 100 is configured to process analog NTSC video signals. The first and second digital filters 212 and 214 can be configured with a second response if the receiver 100 is configured to process DVB-T signals. The filter responses can be selectively programmable to any of a plurality of predetermined frequency responses.

In one embodiment, each of the first and second digital filter 212 and 214 can be implemented as a digital signal processor (DSP) configured to provide a filter response based on one or more filter coefficients stored in a memory (not shown). The first and second digital filters 212 and 214 can be configured to store filter coefficients for a plurality of filter responses, and the DSP can be configured to select a coefficient set based, for example, on a mode or channel configuration.

The first and second digital frequency converters, 252 and 254, can be configured to perform frequency conversion according to any one of various frequency conversion techniques. For example, the first and second digital frequency converters, 252 and 254, can be configured as mixers, multipliers, rotators, or some other frequency converter.

The digital signal combiner 260 can be configured as a signal summer. Additionally, the digital signal combiner 260 can be configured to invert one or both of the digital IF signal components. The digital signal combiner 260 couples the combined, composite digital IF signal to a digital to analog converter (DAC) 270 configured to convert the digital IF signal to an analog IF signal. The analog IF signal represents the output of the digital IF generator 200.

The analog IF signal is coupled to an output filter 170 and an IF amplifier 172. The output filter 170 can be configured to remove any undesired frequency conversion products and any undesired signal components generated by the DAC 270.

Figure 4:
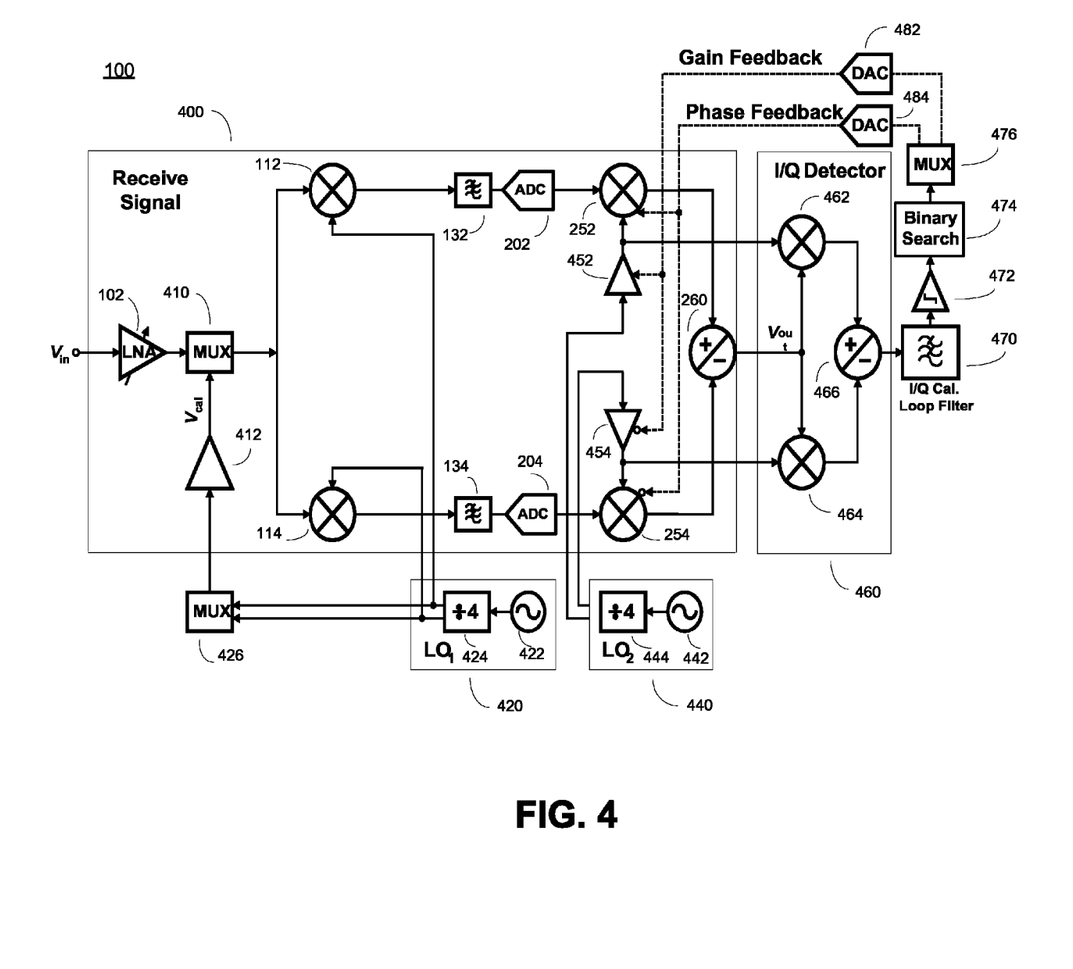
FIG. 4 is a simplified functional block diagram of an embodiment of a receiver with I/Q imbalance calibration.

FIG. 4 is a simplified functional block diagram of an embodiment of a receiver 100 with digital IF generation and I/Q imbalance calibration. The receiver 100 includes a receive signal portion 400 that is configured to receive an input signal and convert it to a digital IF. An I/Q detector 460 is coupled to the output of the receive signal portion 400 and is configured to determine the relative phase and amplitude of the I and Q signal components during a calibration period. One or more feedback loops can operate to correct the amplitude and phase balance of the I and Q signal paths in order to compensate for any path mismatches or imbalances.

The receiver 100 is configured to have a signal processing mode and a calibration mode. The operation of the receiver 100 during signal processing mode is essentially the same as the receiver embodiment shown in FIG. 3.

An input RF signal is coupled to the RF amplifier 102 at the input of the receive signal portion 400 of the receiver 100. The output of the RF amplifier 102 is coupled to a first multiplexer 410 that is configured to select the RF amplifier 102 output during signal processing mode. The first multiplexer 410 couples the RF amplifier 102 output to first and second mixers 112 and 114 to frequency convert the signal to I and Q baseband or low IF signal components.

An RF LO 420 having a LO generator 422 and phase shifter 424 is configured to drive the first and second mixers 112 and 114 with in-phase and quadrature LO signals, respectively. The RF LO 420 can be implemented on the same IC as the receive signal portion 400 or can be configured as a distinct module. The downconverted I and Q signals are filtered in I and Q filters 132 and 134, respectively, before being digitally converted and digitally upconverted to the desired IF.

The I signal is digitally converted using a first ADC 202 while the Q signal is digitally converted in a second ADC 204. The digital I signal is upconverted to a digital in-phase IF signal using a first digital frequency converter 252. The digital Q signal is upconverted to a digital quadrature signal using a second frequency converter 254. A second LO 440 including an LO generator 442 and phase shifter 444 is used to provide the quadrature LO signals to first and second amplifiers 452 and 454 that drive the digital frequency converters 252 and 254. The second LO 440 can be implemented on the same IC or on a module or substrate distinct from the receive signal portion 400.

The digital I and Q IF signal components are coupled to the inputs of a digital signal combiner 260 where they are combined into a composite digital IF output signal. The receive signal portion 400 of the receiver 100 is depicted as providing a digital IF output signal. However, the receiver 100 can include a DAC at the output if an analog IF signal is desired.

The receiver 100 can be configured to self calibrate in order to compensate for any imbalances in the I and Q signal paths. The receiver 100 can be configured to include an I/Q detector 460 couple to one or more feedback loops configured to provide correction signals to compensate for gain and phase imbalances in the I and Q signal paths.

The receiver 100 can perform the calibration process at distinct intervals, such as power up, channel selection, or mode selection. In another embodiment, the receiver 100 can be configured to perform calibration on a periodic basis.

During calibration, a calibration tone can be injected into the front end of the receive signal portion 400. In the embodiment shown in FIG. 4, the I and Q outputs of the first LO 420 are coupled to a tone multiplexer 426. The tone multiplexer 426 is configured to select between the I and Q LO signals and couple the selected tone to a tone amplifier 412 that drives an input of the first multiplexer 410. The first multiplexer 410 is configured to select the tone input during calibration mode.

Because the tone injected into the front end of the receive signal portion is generated by the same first LO 420 that is used to generate the local oscillator signals used in the first frequency conversion, the tone and LO signals are coherent and may differ by only a phase offset. The phase offset can be substantially minimized by minimizing the path differences experienced by the LO signals, or by introducing phase delays in one or more of the LO paths to equalize the paths.

Thus, during the calibration process, the tone multiplexer 426 can be configured to selectively alternate between the in-phase and quadrature LO signals to selectively introduce in-phase and quadrature signals to the receiver 100 front end. The signal in the receive signal portion 400 will be substantially an in-phase signal component during the portion of time that the tone multiplexer selects the in-phase LO signal. Similarly, the signal in the receive signal portion 400 will be substantially a quadrature signal component during the portion of time that the tone multiplexer selects the quadrature LO signal.

When the tone multiplexer 426 selects the in-phase tone, there is substantially no quadrature signal present in the receive signal portion 400. The output of the first and second mixers 112 and 114 are DC signals representative of the phase and amplitude imbalances in the front end portion of the receiver 100. The output from the digital signal combiner 260 is substantially a signal representative of the phase and amplitude contribution introduced by the complete I and Q signal processing path.

The output of the digital signal combiner 260 is coupled to an input of an I/Q detector 460. The I/Q detector 460 includes an in-phase mixer 462 and a quadrature mixer 464 that each have one input coupled to the digital signal combiner 260 output. The LO port of the in-phase mixer 462 is driven by the in-phase LO signal from the second LO 440. The LO port of the quadrature mixer 464 is driven by the quadrature LO signal from the second LO 440. The outputs of the in-phase mixer 462 and quadrature mixer 464 are coupled to inputs of a signal combiner 466. Therefore, the I/Q detector 460 is configured to generate a DC value representative of the composite DC offset from the receiver 400. The composite DC offset is representative of the phase and amplitude imbalance of the receiver 100.

The output of the I/Q detector 460 is coupled to one or more feedback loops. For example, a first feedback lop can be configured to compensate for amplitude imbalance while a second feedback loop can be configured to compensate for phase imbalance. The output of the I/Q detector 460 is typically a DC error signal. The DC error signal is coupled to a calibration loop filter 470 that can be used to adjust the rate that the feedback loop adjusts the imbalances.

The output of the calibration loop filter 470 can be coupled to an amplifier 472 that can be used to amplify the error signal. In one embodiment, the amplifier 472 can be implemented as a comparator that is configured to toggle between two values depending on whether the DC offset is greater or less than a predetermined threshold, such as zero volts. The amplified error signal is coupled to a search module 474, such as a binary search module, that can be configured to determine a feedback value based on a search.

The search module 474 can be configured, for example, to perform a binary search to determine a DC correction value. A binary search uses the amplifier 472 or comparator output to determine if the next increment is to a greater value or a lesser value. The binary search can continue until the search converges on a value. For example, if the search module 474 is configured to provide a 10-bit digital output, the binary search can converge in typically 11 or fewer iterations.

The output of the search module 474 is coupled to a multiplexer 476 that is configured to provide the correction value to either a gain feedback path or a phase feedback path. The gain feedback path includes a DAC 482 coupled to control the gain of the first and second amplifiers, 452 and 454, that drive the digital frequency converters 252 and 254. The phase feedback path includes a DAC 484 coupled to the digital frequency converters 252 and 254 to compensate for phase imbalances.

In one embodiment, the receiver 100 can initiate a calibration mode in which the tone multiplexer 426 selects the in-phase signal and couples the in-phase signal to the receiver 100 front end. The I/Q detector operates on the signal and causes the gain and phase feedback loops to converge upon values that are applied to the corresponding amplifier 452 and digital frequency converter 252. The tone multiplexer 426 can then be configured to select the quadrature LO signal and the process can be repeated for the quadrature amplifier 454 and frequency converter 254.

Figure 5:
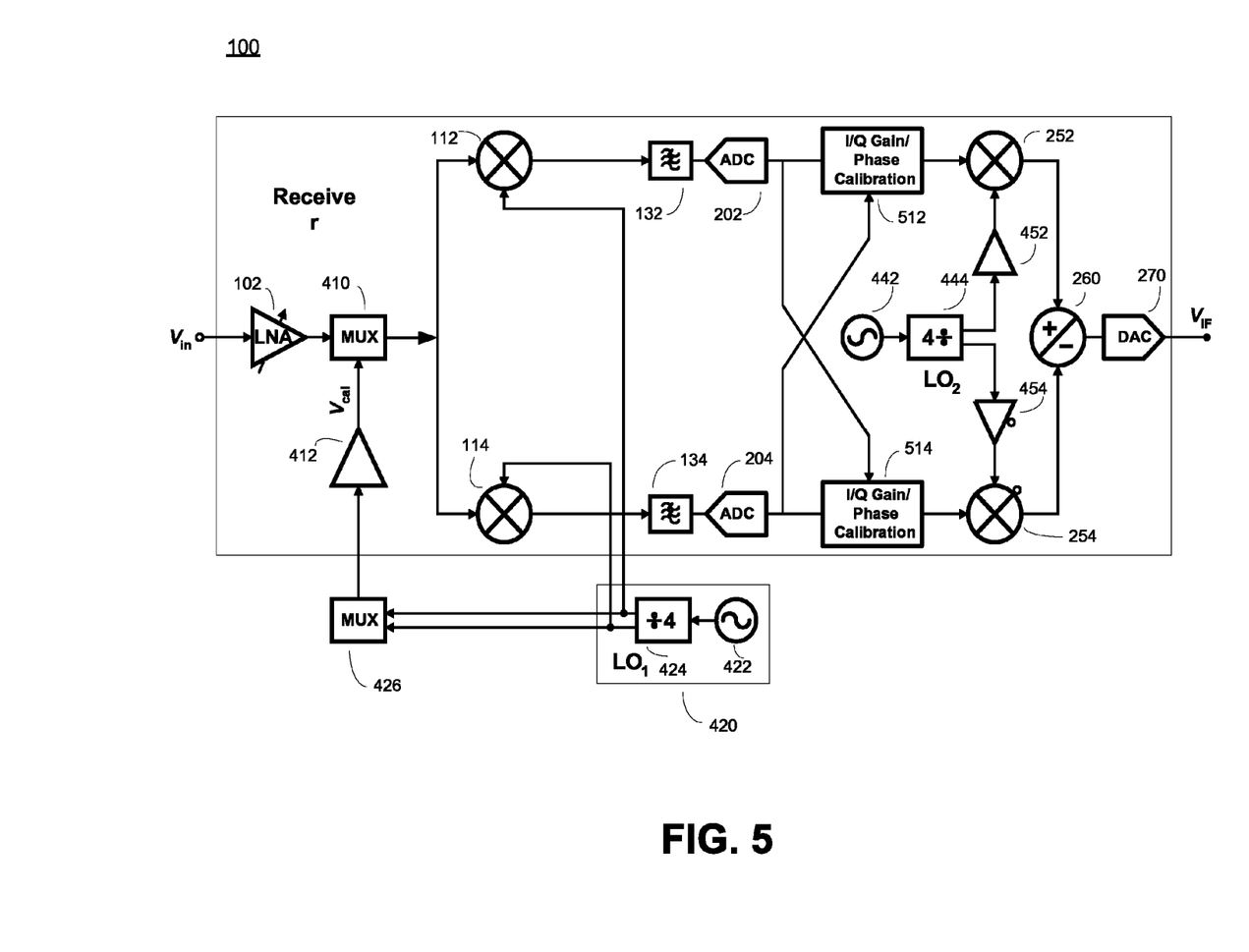
FIG. 5 is a simplified functional block diagram of an embodiment of a receiver with I/Q imbalance calibration.

FIG. 5 is a simplified functional block diagram of an embodiment of a receiver 100 having digital IF generation and I/Q imbalance calibration. The receiver 100 of FIG. 5 is similar to the receiver shown in FIG. 4, except that the I/Q imbalance is performed using digital signal processing I/Q calibration modules 512 and 514 positioned in series with the I and Q signal paths.

The receiver 100 is configured to have at least two operating modes including a signal processing mode and a calibration mode. The receiver 100 operation in the signal processing mode is substantially the same as that described for the receiver embodiments of FIGS. 3 and 4. The embodiment of FIG. 5 includes an output DAC 270 and also explicitly depicts the second LO 442 and phase shifter 444 as implemented in common with the signal processing path of the receiver 100.

As was the case with the embodiment shown in FIG. 4, the embodiment of FIG. 5 includes a first multiplexer 410 configured to select between an RF amplifier 102 output or a tone used during calibration mode. During signal processing mode, the I/Q calibration modules 512 and 514 correct the respective I and Q signal components by gain and phase compensation values determined during the calibration mode.

During calibration mode, the I or Q calibration tone is coupled to the front end of the receiver 100. The first I/Q calibration module 512 is configured to monitor the digital I and Q signal components and is configured to adjust the gain and phase offset applied to the in-phase signal component. Similarly, the second I/Q calibration module 514 is configured to monitor the digital I and Q signal components and is configured to adjust the gain and phase offset applied to the quadrature signal component.

Figure 6:
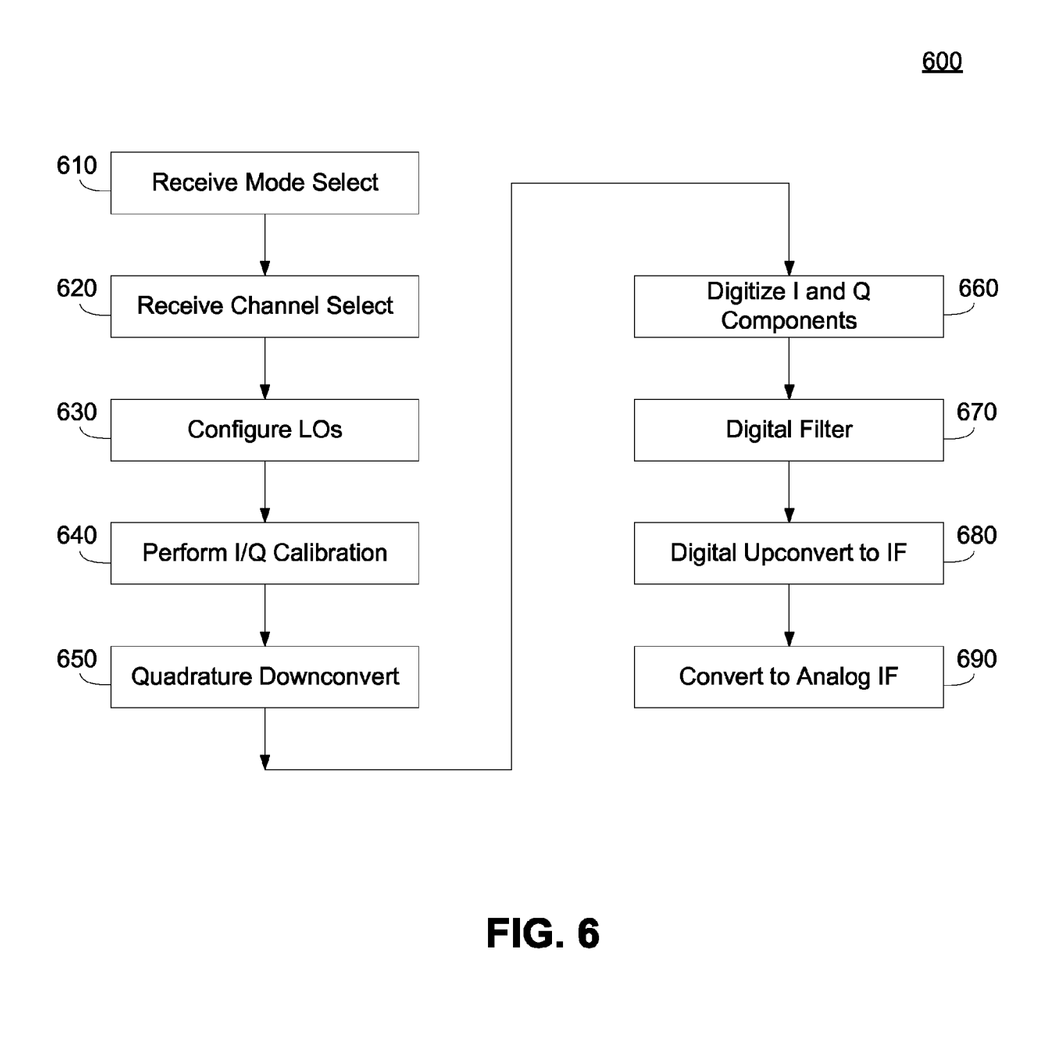
FIG. 6 is a simplified flowchart of a method of receiving signals.

FIG. 6 is a simplified flowchart of a method 600 of receiving a signal, such as a television signal that can be an analog television signal or a digital television signal depending on an operating mode. The method 600 can be performed by any of the receivers shown in FIGS. 1-5. Of course, the method 600 is not limited to processing of television signals.

The method 600 begins at block 610 where the receiver is provided a mode select control signal. The mode select signal may indicate the type of signal that is to be received, the signal source, an operating frequency range, and the like, or some combination of operating parameters. In one embodiment, the mode selection can indicate whether an analog signal, such as an NTSC television signal, or a digital signal, such as a DVB-T signal, is to be processed. The receiver can configure filters and amplifier gains based on the mode selection.

The receiver proceeds to block 620 and receives channel selection information. The receiver can be configured, for example, to receive an indication of an operating frequency band and a frequency of a desired channel or a designator of a desired channel.

The receiver proceeds to block 630 and configures the local oscillator frequencies based on the mode and channel selection information. For example, the receiver can be configured to implement downconversion to a low IF when an NTSC signal is to be received, and may be configured to implement direct downconversion to a zero-IF or baseband if a digital signal is to be received. The receiver may also configure the frequency of the second LO used for upconversion to the desired IF based on the operating mode.

After configuring the local oscillator frequencies, the receiver proceeds to block 640 and performs I/Q calibration, if I/Q calibration is incorporated into the receiver. The receiver can, for example, decouple the input signal from the receiver and introduce one or more calibration tones and correct for any I/Q imbalance based on the calibration tones.

After performing I/Q calibration, the receiver can proceed to block 650 and quadrature downconvert the desired channel to either a baseband signal or a low IF signal, depending on the mode selection. The receiver may also perform partial channel selection in order to remove some interferers and to provide anti-aliasing filtering. The receiver proceeds to block 660 and digitizes the downconverted I and Q signals.

The receiver proceeds to block 670 and digital filters the I and Q signals. The receiver can be configured to perform channel selection in the digital domain using a digital filter selected from a plurality of digital filter responses based on the mode selection.

The receiver proceeds to block 680 and digitally upconverts the I and Q signals to the desired IF. The receiver can be configured to generate a LO signal and perform the frequency conversion completely in the digital domain. As such, the balance and relationship of the I and Q signals may be tightly controlled. The receiver can combine the digital I and Q IF signal components to generate a composite digital IF signal.

The receiver can then proceed to block 690 and convert the digital IF signal to an analog IF signal for processing and demodulation. The receiver can thus interface with legacy processing devices while incorporating digital IF generation.

A receiver and method of receiving signals are described. A receiver can selectively convert a desired RF channel to a low IF or a baseband signal using a direct conversion architecture. The receiver can be configured to downconvert the desired channel to I and Q signal components. The receiver can perform partial channel selection on the downconverted I and Q signals. The receiver can digitize the filtered I and Q signals and can digitally filter each of the digitized I and Q signals to perform channel selection.

The receiver can digitally upconvert the I and Q signals to an IF. The receiver can combine the digital I and Q IF signals to generate a composite digital IF signal. The receiver can convert the digital IF signal to an analog IF signal.

The receiver may implement one or more modules that can be configured to calibrate the receiver signal paths to substantially remove any I and Q imbalance in the signal paths. The modules can include feedback modules or can be implemented as digital signal processing modules placed in series with the I and Q signal paths.

The receiver can be implemented on a single IC. Such an implementation allows the various elements to be better matched than is generally possible using discrete elements or multiple ICs. The ability to closely match the elements of the receiver can reduce the level of DC offset error attributable to element mismatches.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A method of calibrating a quadrature receiver, the method comprising:
   generating a calibration tone using a local oscillator;
   generating a first oscillator signal using the local oscillator;
   injecting the calibration tone to the quadrature receiver;
   mixing the calibration tone with the first oscillator signal;
   detecting an amplitude and phase imbalance of the quadrature receiver;
   adjusting a gain of at least one of an in-phase and a quadrature signal path based on the amplitude imbalance;
   adjusting a phase of at least one of the in-phase and quadrature signal paths based on the phase imbalance, wherein the calibration tone is one of a first quadrature or a first in-phase signal of the first oscillator signal, wherein the calibration tone is mixed with the in-phase signal to produce a first DC component and mixed with the quadrature signal to produce a second DC component;
   digitizing the first DC component to a first digital DC component and the second DC component to a second digital DC component;
   upconverting the first digital DC component to a first intermediate frequency (IF) digital signal with a second in-phase LO signal and the second digital DC component to a second digital IF signal with a second quadrature LO signal;
   combining the first and second digital IF signals to generate a third digital IF signal;
   mixing the third digital IF signal with the second in-phase LO signal to generate a third DC component and the third digital IF signal with the second quadrature LO signal to generate a fourth DC component; and
   summing the third and fourth DC components to generate a DC composite component.

2. The method of claim 1, wherein detecting the amplitude and phase imbalance of the quadrature receiver comprises:
   downconverting the third digital IF signal to a first DC signal;
   downconverting the third digital IF signal to a second DC signal;
   combining the first and second DC signals to generate a combined DC signal; and
   determining the phase imbalance based on the combined DC signal.

3. The method of claim 2 further comprising:
   amplifying the combined DC signal; and
   providing a DC correction value for adjusting the gain or the phase of at least one of the in-phase and quadrature signal path based on the amplified DC signal.

4. A quadrature receiver calibration apparatus, the apparatus comprising:
   a first local oscillator configured to generate a calibration tone and a local oscillator signal;
   a coupler configured to couple the calibration tone to a signal path of the quadrature receiver;
   a first frequency converter configured to mix the calibration tone with the local oscillator signal;
   a detector configured to detect an in-phase and quadrature signal component when the calibration tone is coupled to the signal path;
   a gain feedback module configured to adjust a gain of at least one of an in-phase signal path and a quadrature signal path;
   a phase feedback module configured to adjust a phase of at least one of the in-phase signal path and the quadrature signal path;

a second frequency converter coupled to the first frequency converter and configured to upconvert an output signal of the first frequency converter to an intermediate frequency (IF) signal using a second local oscillator; and a third frequency converter coupled to the second frequency converter and configured to downconvert the IF signal to a DC calibration signal using the second local oscillator.

5. The quadrature receiver calibration apparatus of claim 4 further comprising:

an amplifier configured to amplify the DC calibration signal and provide the amplified DC calibration signal to the gain feedback module and the phase feedback module.

6. The quadrature receiver calibration apparatus of claim 4 further comprising:

an analog filter circuit disposed between the first frequency converter and an ADC and configured to perform at least partial channel selection on the in-phase signal path and the quadrature signal path.

7. A self-calibration receiver comprising:

a first quadrature mixer;

a first oscillator coupled to the first quadrature mixer, the first oscillator having a first in-phase local oscillator (LO) signal and a first quadrature LO signal;

a first multiplexer having a first input terminal coupled to the first in-phase local oscillator (LO) signal and a second input terminal coupled to the first quadrature LO signal and a first output;

a second multiplexer having a third input terminal coupled to the first output of the first multiplexer and a fourth input terminal coupled to an RF signal and a second output coupled to the first quadrature mixer;

an analog-to-digital converter (ADC) coupled to the first quadrature mixer and configured to generate a first DC signal and a second DC signal if the first quadrature mixer is coupled to the first output of the first multiplexer and generate a baseband in-phase signal and a baseband quadrature signal if the first quadrature mixer is coupled to the RF signal;

a second quadrature mixer coupled to the ADC and a second oscillator and configured to generate a composite signal; and a third quadrature mixer coupled to the second quadrature mixer and the second oscillator and configured to provide a DC calibration signal based on the composite signal if the first quadrature mixer is coupled to the first output of the first multiplexer.

8. The self-calibration receiver of claim 7 further comprising:

an amplifier configured to amplify the DC calibration signal; and a feedback module configured to adjust a gain and a phase of the second quadrature mixer in response to the amplified DC calibration signal.

9. The self-calibration receiver of claim 7 further comprising:

an analog filter circuit disposed between the first quadrature mixer and the ADC and configured to perform at least partial channel selection on the baseband in-phase signal and the baseband quadrature signal.

* * * * *